United States Patent
Litwin, Jr. et al.

(10) Patent No.: US 7,139,966 B2
(45) Date of Patent: Nov. 21, 2006

(54) DIVERSITY SCHEME FOR ERROR CONTROL CODING IN A SYSTEM WITH PRIORITIZED DATA

(75) Inventors: Louis Robert Litwin, Jr., Plainsboro, NJ (US); Kumar Ramaswamy, Princeton, NJ (US)

(73) Assignee: Thomson Licensing, Boulogne-Billancourt (FR)

( * ) Notice: Subject to any disclaimer, the term of this patent is extended or adjusted under 35 U.S.C. 154(b) by 0 days.

(21) Appl. No.: 10/511,647

(22) PCT Filed: Apr. 17, 2003

(86) PCT No.: PCT/US03/11957

§ 371 (c)(1),
(2), (4) Date: Oct. 18, 2004

(87) PCT Pub. No.: WO03/090363

PCT Pub. Date: Oct. 30, 2003

(65) Prior Publication Data

US 2005/0257122 A1    Nov. 17, 2005

Related U.S. Application Data

(60) Provisional application No. 60/374,030, filed on Apr. 19, 2002.

(51) Int. Cl.
*H03M 13/00* (2006.01)
(52) U.S. Cl. ........................................ 714/776
(58) Field of Classification Search ............. 370/389, 370/229–234; 704/258, 262

See application file for complete search history.

(56) References Cited

U.S. PATENT DOCUMENTS

| | | | |
|---|---|---|---|
| 6,041,345 A | 3/2000 | Levi et al. | |
| 6,167,060 A | 12/2000 | Vargo et al. | |
| 6,317,462 B1 | 11/2001 | Boyce | |
| 6,421,387 B1 * | 7/2002 | Rhee | 375/240.27 |
| 6,675,346 B1 * | 1/2004 | Tsunoda | 714/774 |

OTHER PUBLICATIONS

Carle et al. Survey of Error Recovery Techniques for IP-Based Audio-Visual Multicast Applications. !EEE Network. Nov./Dec. 1977.*
Perkins et al. A Survey of Packet Loss Recovery Techniques for Streaming Audio. !EEE Network, Sep./Oct. 1998.*
Nonnenmacher et al. Parity-Based Loss Recovery for Reliable Multicast Transmission. 1997 ACM.*
Copy of Search Report Dated Jun. 28, 2003.

* cited by examiner

*Primary Examiner*—Albert Decady
*Assistant Examiner*—Sam Rizk
(74) *Attorney, Agent, or Firm*—Joseph J. Laks; Ronald H. Kurdyla; Brian J. Dorini

(57) ABSTRACT

There is provided a method of diversity error control coding for a system having variable-length packets that carry prioritized data. High priority packets in a data sequence are replicated to form virtual replications. Parity symbols are generated from the data sequence and from the virtual replications, and tag information is generated that indicates a number of the virtual replications used to generate the parity symbols, for subsequent transmission of only the data sequence, the parity symbols, and the tag information to reconstruct the data sequence.

15 Claims, 7 Drawing Sheets

DIVERSITY SCHEME FOR ERROR CONTROL CODING IN A SYSTEM WITH PRIORITIZED DATA

CROSS-REFERENCE TO RELATED APPLICATIONS

This application claims the benefit, under 35 U.S.C. § 365 of International Application PCT/US03/11957, filed Apr. 17, 2003, which was published in accordance with PCT Article 21(2) on Oct. 30, 2003 in English and which claims the benefit of U.S. Provisional Patent Application No. 60/374,030, filed Apr. 19, 2002.

This is a non-provisional application claiming the benefit under 35 U.S.C. § 119 of provisional application Ser. No. 60/374,030, entitled "DIVERSITY SCHEME FOR ERROR CONTROL CODING IN A SYSTEM WITH PRIORITIZED DATA", filed on 19 Apr. 2002, which is incorporated by reference herein.

BACKGROUND OF THE INVENTION

1. Field of the Invention

The present invention generally relates to information transmission systems having variable-length packets that carry prioritized data and, more particularly, to a diversity error control coding method and apparatus for use with such systems.

2. Background of the Invention

Some information transmission systems employ both variable-length packets as well as prioritized data (i.e., some data can be classified as low-priority and some can be classified as high priority). Examples of such systems include those having recent audio and video coding schemes.

Prior systems have included separating high and low priority traffic and differentially protecting them with different error control codes. Interleaving is also commonly used to spread/despread a burst of errors to make the block coding mechanism more efficient.

Other information transmission systems only employ variable-length packets and not prioritized data. In such systems, the prior art (see, e.g., J. Boyce, "Packet Loss Resilient Transmission of MPEG Video Over The Internet", Signal Processing: Image Communication 15, pp. 7–24, 1999) discusses techniques to group several variable-length packets together and to form code words along the vertical dimension. FIG. 1 is a block diagram illustrating a grouping of variable-length packets 102A–F, according to the prior art. Code words are formed across several packets vertically, and the associated parity symbols are transmitted in a separate packet. For example, the first codeword is formed from the first symbol from each packet. The second codeword is formed from the second symbol from each packet, and so on. The associated parity bytes are transmitted in a separate packet. Since some code words are shorter than others, the size of the vertical code words will vary. A mother code can be used and variable-length codewords can be formed by shortening the mother code to the appropriate length.

The problem with the prior art techniques is that no additional protection is given to high priority data. One possibility is to group the high priority packets together and send them separately using more parity symbols. However, the drawback of this approach is that there will be increased latency while waiting for enough high priority packets. In practice, the high priority packets are arranged sparsely. For example, in video, a high priority packet might contain an I-frame and it will be in the middle of several predictive frames that would be marked as low-priority.

Accordingly, it would be desirable and highly advantageous to have a diversity error control coding method and apparatus for use with information transmission systems having variable-length packets that carry prioritized data that overcomes the above-described deficiencies of the prior art.

SUMMARY OF THE INVENTION

The problems stated above, as well as other related problems of the prior art, are solved by the present invention, a diversity error control coding method and apparatus for information transmission systems having variable-length packets that carry prioritized data.

According to an aspect of the present invention, there is provided a method of diversity error control coding for a system having variable-length packets that carry prioritized data. High priority packets in a data sequence are replicated to form virtual replications. Parity symbols are generated from the data sequence and from the virtual replications, and tag information is generated that indicates a number of the virtual replications used to generate the parity symbols, for subsequent transmission of only the data sequence, the parity symbols, and the tag information to reconstruct the data sequence.

According to another aspect of the present invention, there is provided a method of diversity error control decoding for a system having variable-length packets that carry prioritized data. Data packets, parity packets, and tag information are received. The parity packets have parity symbols generated from both the data packets and from replications of high priority ones of the data packets. The tag information is for indicating a number of the replications used to generate the parity symbols. The data sequence is reconstructed from the received the data packets, the parity symbols, and the tag information, without any one of a transmission and receipt of the replications.

According to yet another aspect of the present invention, there is provided an apparatus for diversity error control coding in a system having variable-length packets that carry prioritized data. A replicator replicates high priority packets in a data sequence to form virtual replications. A parity symbol generator generates parity symbols from the data sequence and the virtual replications. A tag information generator generates tag information that indicates a number of the virtual replications used to generate the parity symbols. Only the data sequence, the parity symbols, and the tag information are subsequently transmitted to reconstruct the data sequence.

According to still yet another aspect of the present invention, there is provided an apparatus for diversity error control coding in a system having variable-length packets that carry prioritized data. A decoder receives a data sequence that includes data packets, parity packets, and tag information. The parity packets have parity symbols generated from both the data packets and from replications of high priority ones of the data packets. The tag information indicates a number of the replications used to generate the parity symbols. The decoder reconstructs data symbols in the data packets without any receipt of the replications, and using at least the parity bits and the tag information.

These and other aspects, features and advantages of the present invention will become apparent from the following detailed description of preferred embodiments, which is to be read in connection with the accompanying drawings.

DETAILED DESCRIPTION OF THE INVENTION

The present invention is directed to a diversity error control coding method and apparatus for information transmission systems having variable-length packets that carry prioritized data. The invention achieves a "diversity gain" by performing a virtual repetition of the high priority packets and computing additional parity symbols for this repetition. The only additional transmission is the additional parity symbols for high priority packets and tag information that indicates the number of virtual repetitions that were used to create the parity symbols; the high priority packets are NOT sent multiple times. As used herein, the phrase "information transmission system" refers to any system capable of using, transmitting, and/or receiving information.

The transmission of the additional parity symbols and the use of the virtual repetition of the high priority symbols gives a type of "diversity gain" similar to the way diversity is used in communication systems with multiple antennas (so-called antenna diversity). This diversity gain occurs because it is possible that one version of the high priority packet cannot be reconstructed but perhaps other versions of it (one of the virtual repetitions) can be corrected.

It is to be understood that the present invention may be implemented in various forms of hardware, software, firmware, special purpose processors, or a combination thereof. Preferably, the present invention is implemented as a combination of hardware and software. Moreover, the software is preferably implemented as an application program tangibly embodied on a program storage device. The application program may be uploaded to, and executed by, a machine comprising any suitable architecture. Preferably, the machine is implemented on a computer platform having hardware such as one or more central processing units (CPU), a random access memory (RAM), and input/output (I/O) interface(s). The computer platform also includes an operating system and microinstruction code. The various processes and functions described herein may either be part of the microinstruction code or part of the application program (or a combination thereof) that is executed via the operating system. In addition, various other peripheral devices may be connected to the computer platform such as an additional data storage device and a printing device.

It is to be further understood that, because some of the constituent system components and method steps depicted in the accompanying Figures are preferably implemented in software, the actual connections between the system components (or the process steps) may differ depending upon the manner in which the present invention is programmed. Given the teachings herein, one of ordinary skill in the related art will be able to contemplate these and similar implementations or configurations of the present invention.

Figure 1:
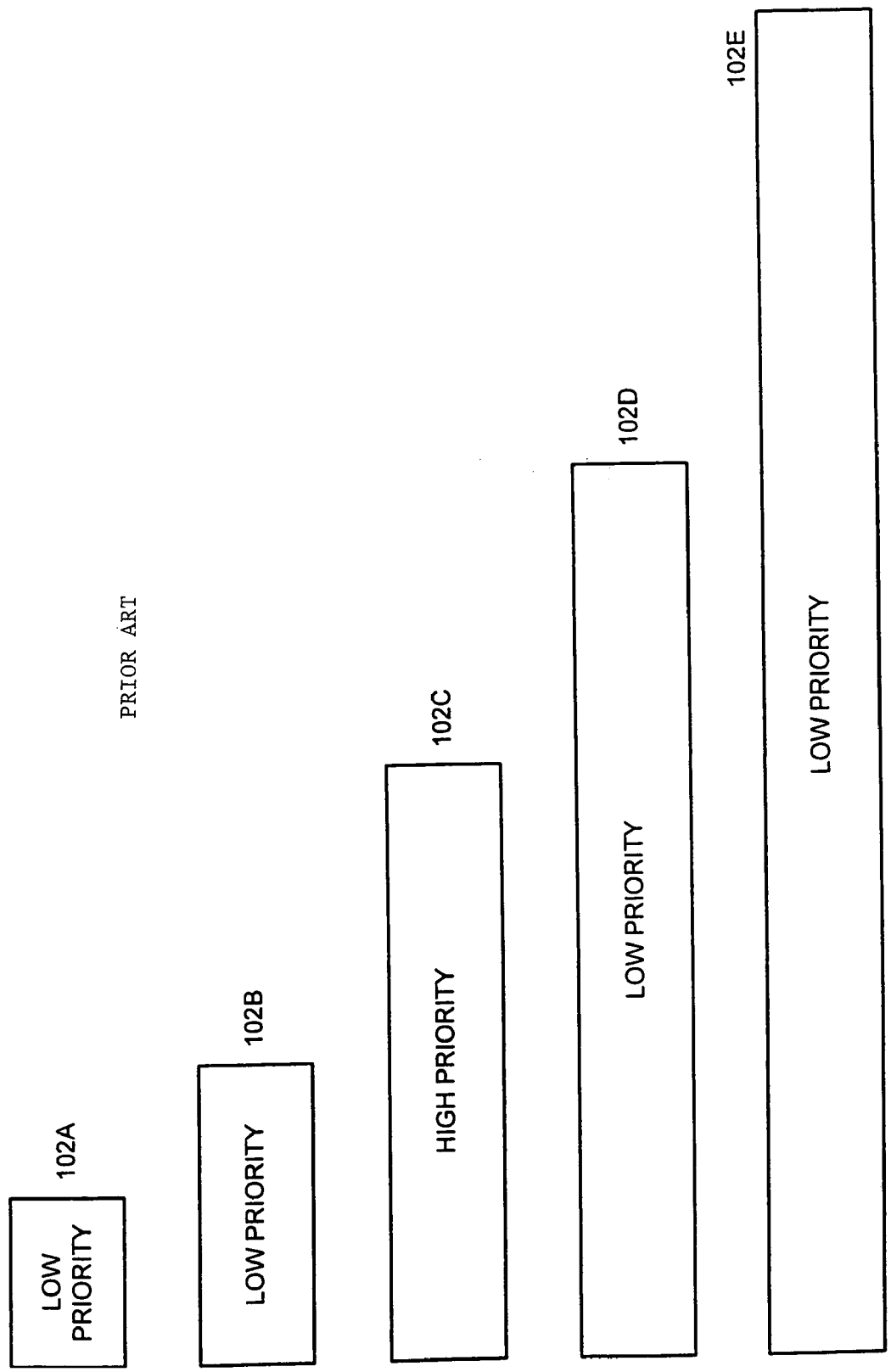
FIG. 1 is a block diagram illustrating a grouping of variable-length packets, according to the prior art.
Figure 2:
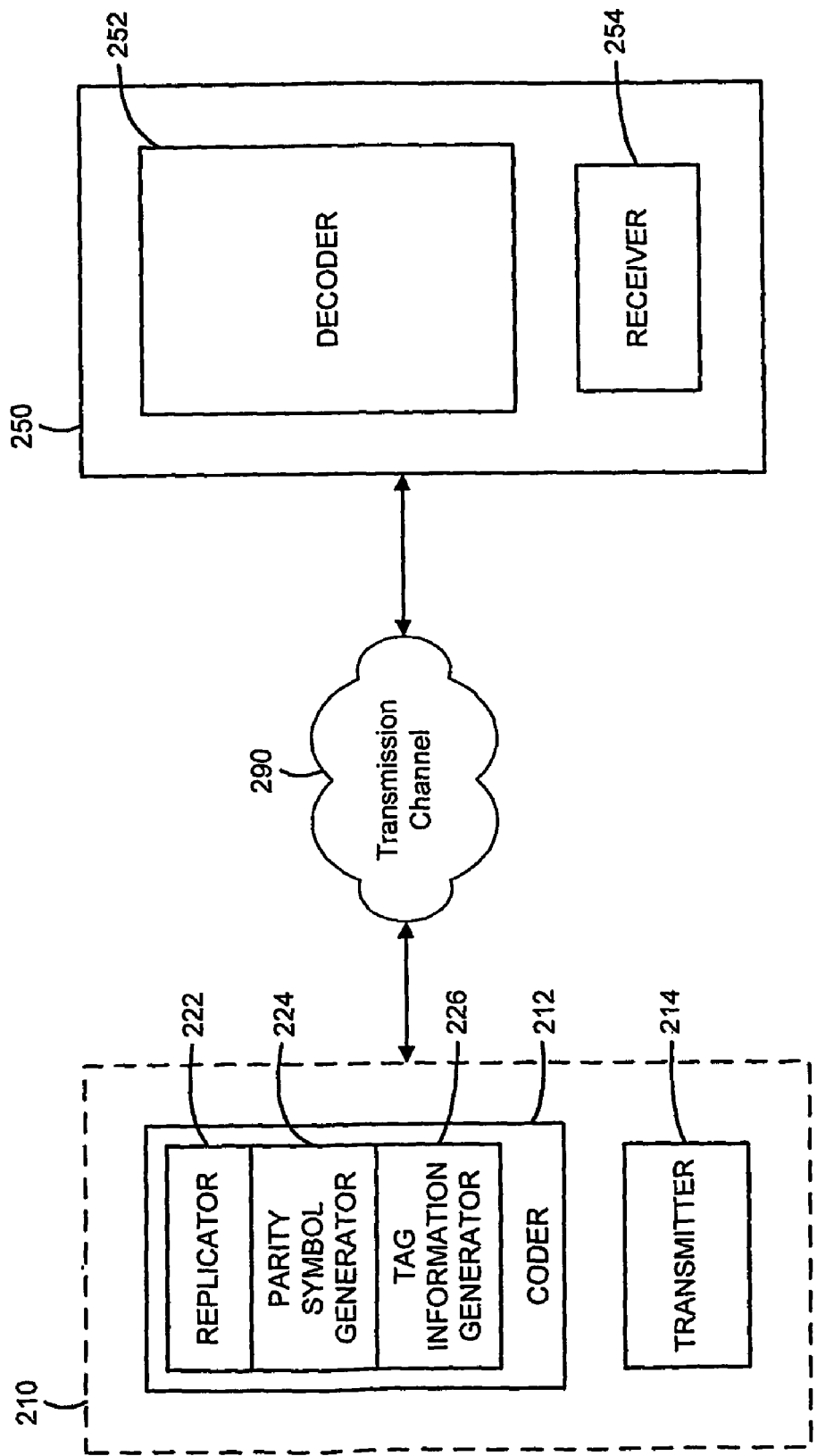
FIG. 2 is a block diagram illustrating a system 200 to which the present invention may be applied, according to an illustrative embodiment of the present invention.

FIG. 2 is a block diagram illustrating a system 200 to which the present invention may be applied, according to an illustrative embodiment of the present invention. The system 200 includes a transmitting portion 210 and a receiving portion 250 coupled via a network or transmission channel 290. It is to be appreciated that the present invention may be used in any type of system that employs variable-length packets that carry prioritized data. Moreover, it is to be further appreciated that in such a system, the functions of coding and transmitting and as well as the functions of receiving and decoding may be interchangeably performed throughout the system so as to exchange data.

The transmitting portion 210 includes a coder 212 for coding data and a transmitter 214 for transmitting the data and other information as described herein below. The coder 212 includes a replicator 222, a parity symbol generator 224, and a tag information generator 226. The replicator 222 generates virtual replications of high priority packets. The parity symbol generator 224 generates parity symbols for both high and low priority packets of data as well as for the virtual replications of the high priority packets. The tag information generator 226 generates tag information that indicates the number of virtual representations (i.e., how many virtual representations were created for a given high priority packet, in creating the parity symbols).

The transmitting portion 250 includes a receiver 254 for receiving data, and a decoder 252 for decoding the data. It is to be appreciated that the coder 212 and the decoder 252 may be replaced by other elements capable of performing the same function while still maintaining the spirit and scope of the present invention. For example, codecs may be used.

A brief description will now be given of some observations related to this invention. First, high priority packets tend to be fairly long. For an example pertaining to video data, the high priority packets are I-frames that contain a lot of data whereas the low-priority packets are predictive frames that do not contain as much data. Second, the "erasures" type of coding will be used, where a dropped or lost packet is handled by marking the entire packet as an erasure. Erasures are a known technique in error control coding where the decoder is informed of the location of an error from some entity that is external to the decoder. For example, the processing that detects a lost packet can inform the decoder of the associated erasures. Third, the longer the packet, the higher the probability of a lost packet. For example, in a wireless system, it is possible that channel conditions can change more severely during the longer duration of the transmission of a long packet. By comparison, there is less of a chance that conditions such as a channel null or impulse noise will occur during short packets.

Figure 3:
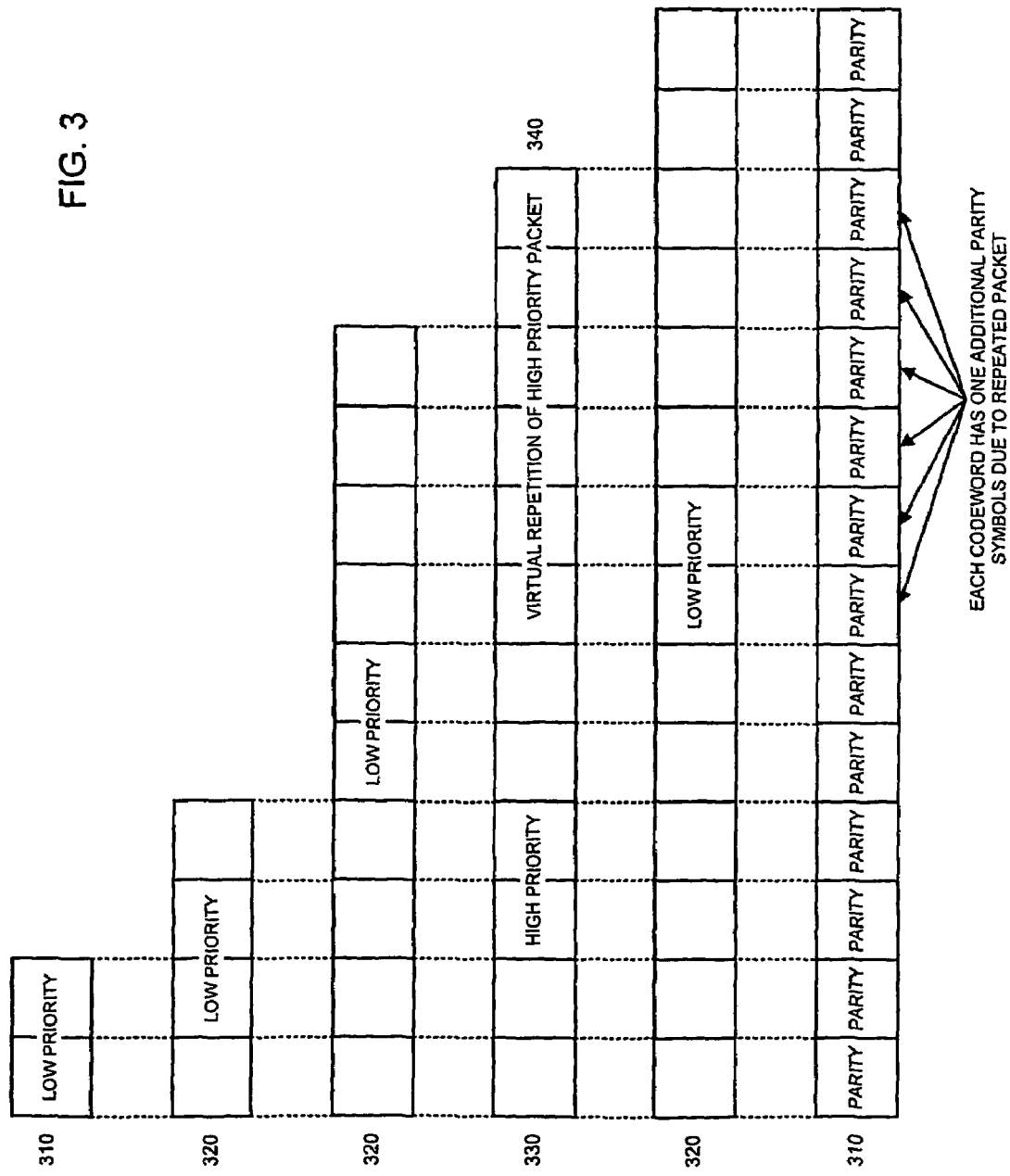
FIG. 3 is a block diagram illustrating the use of virtual replications of high priority packets, according to an illustrative embodiment of the present invention.

A brief overview will now be given of the present invention. In general, the present invention forms virtual replications of high priority packets at the encoder. FIG. 3 is a block diagram illustrating the use of virtual replications of high priority packets, according to an illustrative embodiment of the present invention. The packets 310 shown in FIG. 3 include a parity packet 310, low priority packets 320, a high priority packet 330, and a virtual repetition 340 of the high priority packet.

As used herein, the term "virtual replication" refers to a replication of the data at the transmitter for encoding purposes, such that the replicated data is not actually transmitted over a communications channel. The high priority packets are replicated by repeating them (for as many times as needed to effect the required level of error protection) end-to-end, as illustrated by the shaded packet 340 shown in FIG. 3 that represents a virtual repetition of the high priority packet 330. The associated parity symbols (pointed at by arrows in FIG. 3) are formed by encoding the two low-priority packets as well as the virtual replication of the high priority packet.

Only the first instance of the high priority packet is transmitted over the channel. The virtual replication is NOT transmitted. The only additional transmission employed by the present invention is the transmission of the additional parity symbols that result from the use of the virtual replication, and the tagging of the replication information (on the order of a few bits per symbol).

At the decoder, the virtual replications are formed by replicating the associated received high priority packets and the packets are decoded and the errors are corrected.

The benefit of the present invention is that while it is possible that the original version of the high priority packet cannot be correctly decoded (due to, for example, a large number of errors from dropped packets), it is possible that one of the virtual replications can be decoded correctly due to the inherent diversity in this scheme. As long as just one version of the high priority packets (whether it is the original packet or its virtual replication) can be decoded correctly, the high priority packet will have been received properly. This can be best illustrated by way of example.

Figure 4:
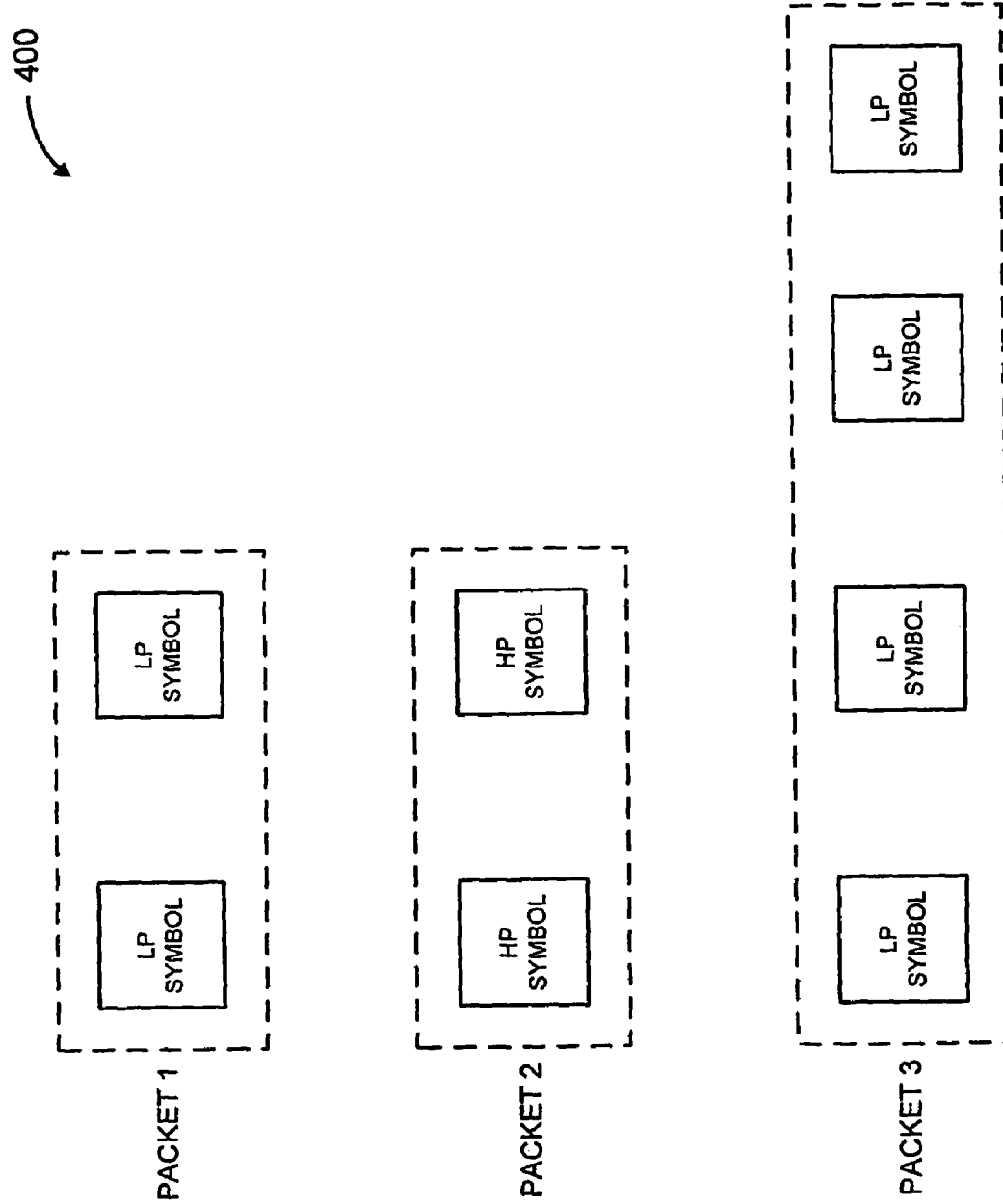
FIG. 4 is a diagram illustrating the packet structure used in the example, according to an illustrative embodiment of the present invention.
Figure 5:
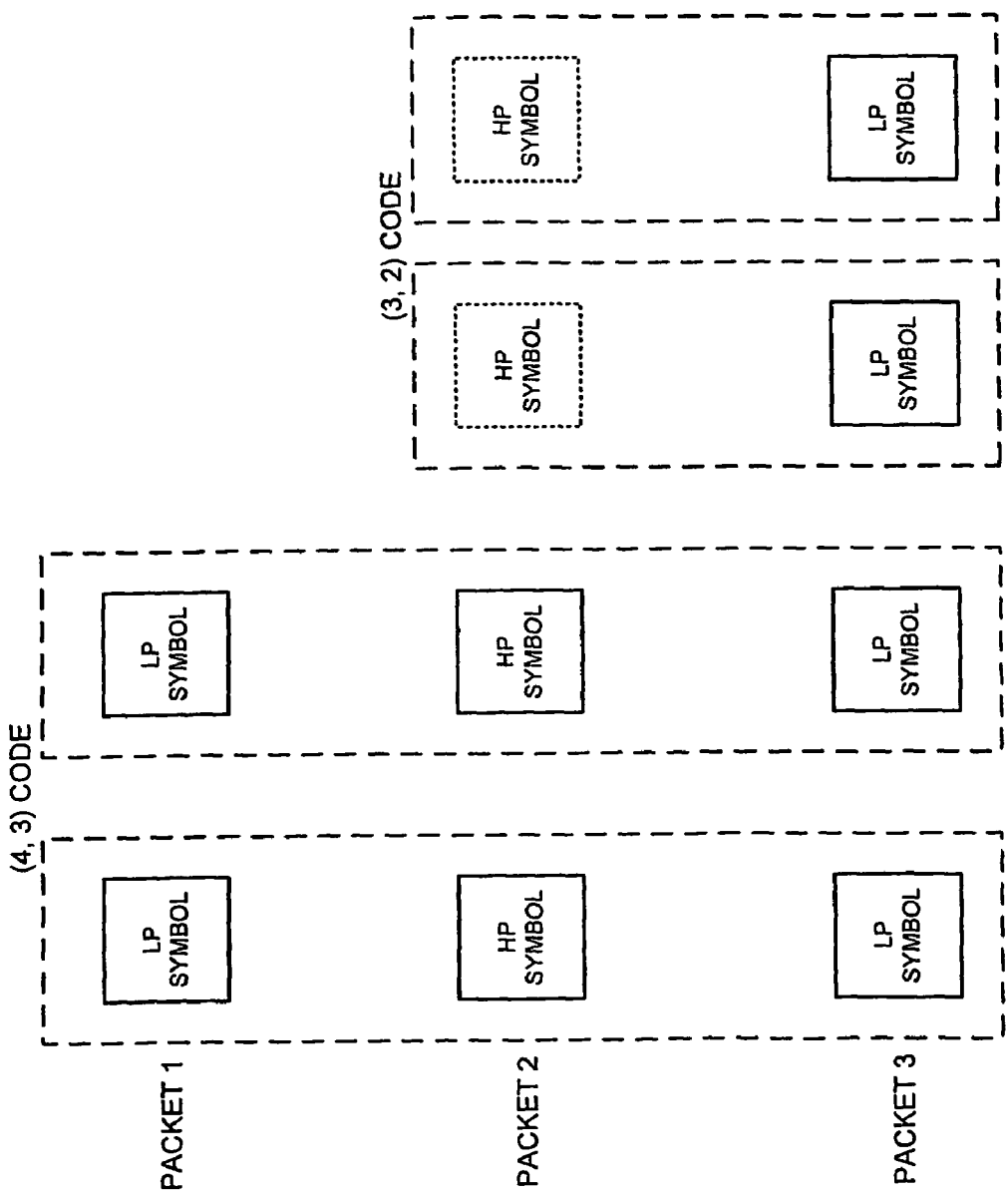
FIG. 5 is a diagram illustrating the application of codes to packets, according to an illustrative embodiment of the present invention.
Figure 6:
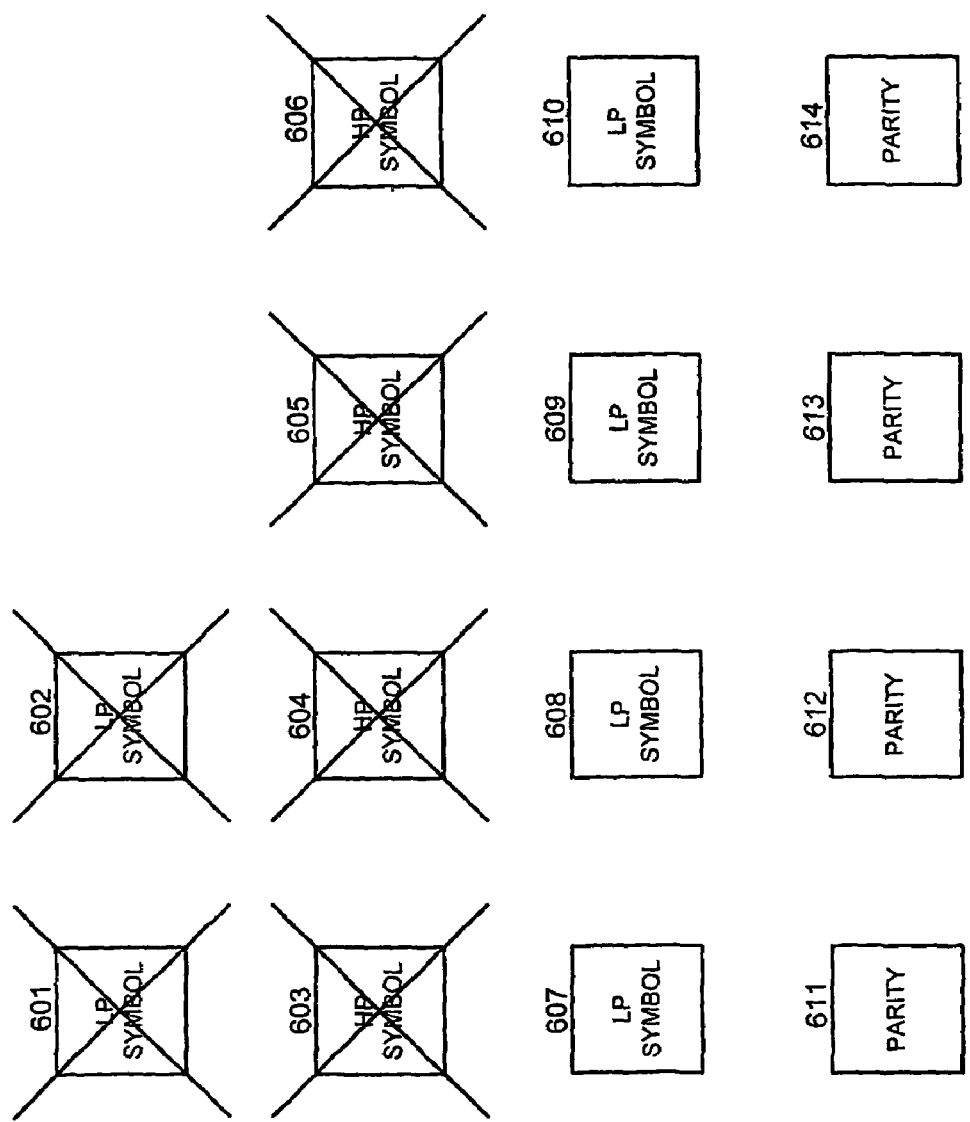
FIG. 6 is a diagram illustrating patterns of errors used in the example, according to an illustrative embodiment of the present invention.

A brief example of the present invention will now be provided with respect to FIGS. 4–6. FIG. 4 is a diagram illustrating the packet structure 400 used in the example, according to an illustrative embodiment of the present invention. FIG. 5 is a diagram illustrating the application of codes to packets, according to an illustrative embodiment of the present invention. FIG. 6 is a diagram illustrating patterns of errors used in the example, according to an illustrative embodiment of the present invention.

The example will employ three packets. Packet 1 is low priority with 2 symbols. As shown in FIG. 5, the two high priority symbols of Packet 2 are replicated (indicated by symbols with dotted lines) and then the code is applied vertically across packets. Different code sizes are used due to the different lengths of the packets. A (4,3) code is used on the first two columns. The code has 3 data symbols and adds 1 parity symbol to form a codeword of length 4. A (3,2) code is used on the third and fourth columns. The code has 2 data symbols and adds 1 parity symbol to form a codeword of length 3. Both of these codes are capable of correcting just one error. The assumption is that erasures decoding is used and in such a scheme, each parity symbol can correct a single error.

Assume that the packets arrive at the receiver with the error pattern shown in FIG. 6. The X's indicate symbols that are received in error. Recall that a maximum of one error per codeword can be corrected.

There are errors in every symbol in both Packets 1 and 2 (perhaps due to lost packets). The first two columns have 2 errors in each vertical codeword. Since that exceeds the correcting capability of the code, NONE of the data in that column can be recovered (even the low-priority symbols from Packet 3). However, columns 3 and 4, which contain the virtual replication of the high priority symbols, only contain 1 error each, and thus the errors in the virtual replication of the high priority symbols CAN be recovered. Although Packets 1 and 3 are lost, the high priority Packet 2 can be successfully recovered by using the present invention (without the present invention high priority Packet 2 would not be recoverable). In addition, once the high priority Packet 2 is recovered from its virtual replication, it can be substituted back in for the original high priority symbols in the first two columns as correct symbols. Then there is only one error per column and the errors in Packet 1 can also be corrected via this bootstrap method.

Figure 7:
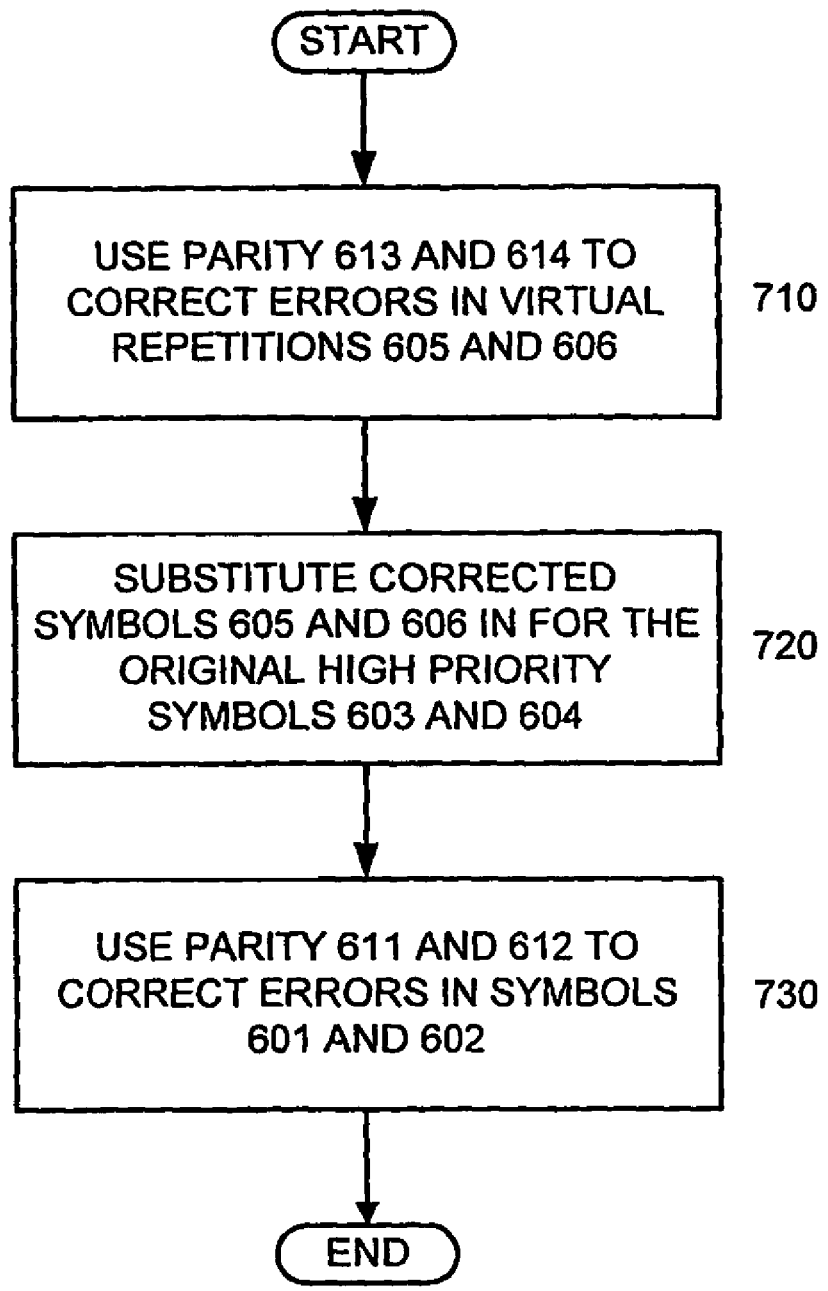
FIG. 7 is a flow diagram illustrating a bootstrap method based on the error pattern of FIG. 6, according to an illustrative embodiment of the present invention.

FIG. 7 is a flow diagram illustrating a bootstrap method based on the error pattern of FIG. 6, according to an illustrative embodiment of the present invention.

Parity symbols 613 and 614 are used to correct errors in virtual repetitions 605 and 606 (step 710). Thus, one parity symbol can correct one error.

Corrected symbols 605 and 606 are substituted in for the original high priority symbols 603 and 604 (step 720). Thus, parity symbols 611 and 612 could not correct two errors but substitution "removes" one of the errors.

Parity symbols 611 and 612 are used to correct errors in symbols 601 and 602 (step 730). Thus, there is one error and one parity symbol, so the error can be corrected.

Therefore, the advantage of sending parity symbols instead of simply replicating and transmitting the original high priority packets multiple times is that when an error is made, the original high priority packet is recovered from other correctly received packets via the bootstrap method illustratively described with respect to FIG. 7. As is evident to one of ordinary skill in the related art, this method performs better than a simple packet replication scheme for the same amount of transmitted information.

The only additional transmitted overhead required by the present invention for this example is the transmission of 1 additional parity symbol (one symbol for the codeword of column 3 and one for column 4) and tag information to indicate how many times the data is replicated (on the order of a few bits for the HP packet).

A brief description will now be given of several main concepts and advantages of the present invention. The present invention is directed to diversity error control coding for use in a information transmission system with variable-length packets that carry prioritized data. High priority packets are replicated to form virtual replications of the data. Virtual replications are used in the encoding process to generate associated parity symbols, but the replications are NOT transmitted over the channel (thus conserving bandwidth). Virtual replications of the received data are used by the decoder to decode the data. The diversity aspect of decoding allows the high priority data to be correctly decoded as long as one or more of the virtual replications of the data are successfully decoded. The present invention advantageously provides the ability to make the number of replications a function of the priority (e.g., different levels of priority can have different numbers of repetitions).

Although the illustrative embodiments have been described herein with reference to the accompanying drawings, it is to be understood that the present invention is not limited to those precise embodiments, and that various other changes and modifications may be affected therein by one of ordinary skill in the related art without departing from the scope or spirit of the invention. All such changes and modifications are intended to be included within the scope of the invention as defined by the appended claims.

The invention claimed is:

1. A method of diversity error control coding for a system having variable-length packets that carry prioritized data, comprising the steps of:
   replicating high priority packets in a data sequence to form virtual replications; and
   generating parity symbols from the data sequence and from the virtual replications and generating tag information that indicates a number of the virtual replications used to generate the parity symbols, for subsequent transmission of only the data sequence, the parity symbols, and the tag information to reconstruct the data sequence.

2. The method of claim 1, further comprising the step of transmitting, without the virtual replications, only the data sequence, the parity symbols, and the tag information, for subsequent reconstruction of the data sequence.

3. A method of diversity error control decoding for a system having variable-length packets that carry prioritized data, comprising the steps of:
   receiving data packets having data from a data sequence, parity packets, and tag information, the parity packets having parity symbols generated from both the data packets and from replications of high priority ones of the data packets, and the tag information for indicating a number of the replications used to generate the parity symbols; and
   reconstructing the data sequence from the received data packets, the parity symbols, and the tag information, without any one of a transmission and receipt of the replications.

4. The method of claim 3, wherein said reconstructing step comprises the step of reconstructing the replications from the tag information and the parity symbols without ever actually receiving the replications.

5. The method of claim 3, wherein said reconstructing step comprises the steps of:
   arranging the packets vertically to form columns of symbols; and
   applying at least one codeword to each of the columns of symbols.

6. The method of claim 5, wherein for a packet that spans at least one of the columns and that has an error therein, said reconstructing step comprises the steps of:
   recovering at least one symbol corresponding to the error using the parity symbols;
   substituting the at least one symbol into at least one other of the columns to recover at least one other symbol.

7. The method of claim 5, wherein said reconstructing step comprises the steps of:
   recovering a packet in at least one of the columns, the packet having an error therein; and
   substituting at least one symbol corresponding to the recovered packet for at least one other symbol in at least another one of the columns to recover at least another packet.

8. An apparatus for diversity error control coding in a system having variable-length packets that carry prioritized data, comprising:
   a replicator for replicating high priority packets in a data sequence to form virtual replications;
   a parity symbol generator for generating parity symbols from the data sequence and the virtual replications; and
   a tag information generator for generating tag information that indicates a number of the virtual replications used to generate the parity symbols;
   wherein only the data sequence, the parity symbols, and the tag information are subsequently transmitted to reconstruct the data sequence.

9. The apparatus of claim 8, further comprising a transmitter for transmitting, without the virtual replications, only the data sequence, the parity symbols, and the tag information, for subsequent reconstruction of the data sequence from only the data sequence, the parity symbols, and the tag information.

10. An apparatus for diversity error control coding in a system having variable-length packets that carry prioritized data, comprising:
    a decoder for receiving a data sequence that includes data packets, parity packets, and tag information, the parity packets having parity symbols generated from both the data packets and from replications of high priority ones of the data packets, and the tag information for indicating a number of the replications used to generate the parity symbols,
    wherein said decoder reconstructs data symbols in the data packets without any receipt of the replications, and using at least the parity bits and the tag information.

11. The apparatus of claim 10, wherein said decoder reconstructs the data symbols by at least reconstructing the replications from the tag information and the parity symbols without ever actually receiving the replications.

12. The apparatus of claim 10, further comprising a receiver for initially receiving the data sequence and for forwarding the data sequence to the decoder.

13. The apparatus of claim 10, wherein said decoder arranges the packets vertically to form columns of symbols, and applies at least one codeword to each of the columns of symbols.

14. The apparatus of claim 13, wherein for a packet that spans at least one of the columns and that has an error therein, said decoder recovers at least one symbol corresponding to the error using the parity symbols and substitutes the at least one symbol into at least one other of the columns to recover at least one other symbol.

15. The apparatus of claim 13, wherein said decoder recovers a packet in at least one of the columns, the packet having an error therein, and substitutes at least one symbol corresponding to the recovered packet for at least one other symbol in at least another one of the columns to recover at least another packet.

* * * * *